United States Patent
Matsumoto et al.

(10) Patent No.: US 9,165,919 B2
(45) Date of Patent: Oct. 20, 2015

(54) SEMICONDUCTOR DEVICE

(75) Inventors: Hideaki Matsumoto, Saitama (JP); Jun Yamashita, Saitama (JP); Kenji Esashika, Saitama (JP); Takao Sugino, Saitama (JP)

(73) Assignee: NEW JAPAN RADIO CO., LTD. (JP)

( * ) Notice: Subject to any disclaimer, the term of this patent is extended or adjusted under 35 U.S.C. 154(b) by 0 days.

(21) Appl. No.: 14/378,665

(22) PCT Filed: Feb. 28, 2012

(86) PCT No.: PCT/JP2012/054997
§ 371 (c)(1),
(2), (4) Date: Aug. 14, 2014

(87) PCT Pub. No.: WO2013/128583
PCT Pub. Date: Sep. 6, 2013

(65) Prior Publication Data
US 2015/0001590 A1    Jan. 1, 2015

(51) Int. Cl.
*H01L 27/02* (2006.01)
*H01L 27/06* (2006.01)

(52) U.S. Cl.
CPC ........ *H01L 27/0248* (2013.01); *H01L 27/0262* (2013.01); *H01L 27/0623* (2013.01)

(58) Field of Classification Search
CPC ............ H01L 27/0259; H01L 27/0248; H01L 27/0623
USPC .......... 257/133, 173, 355, 360, 371, E27.015, 257/273
See application file for complete search history.

(56) References Cited

U.S. PATENT DOCUMENTS

| 6,774,417 | B1* | 8/2004 | Lin et al. ........................ 257/287 |
| 2007/0145484 | A1* | 6/2007 | Hosokawa et al. ........... 257/355 |
| 2007/0170515 | A1* | 7/2007 | Collins et al. ................. 257/371 |
| 2009/0302423 | A1 | 12/2009 | Takahashi et al. |

(Continued)

FOREIGN PATENT DOCUMENTS

| JP | 6123353 | 1/1986 |
| JP | 2001267496 | 9/2001 |

(Continued)

OTHER PUBLICATIONS

International Search Report, International Application No. PCT/JP2012/054997, dated May 22, 2012, (2 pages).

(Continued)

*Primary Examiner* — Lynne Gurley
*Assistant Examiner* — Tong-Ho Kim
(74) *Attorney, Agent, or Firm* — Perman & Green, LLP

(57) ABSTRACT

A semiconductor device that is equipped with an ESD protection element, which has a size increase thereof suppressed, does not require extra process, and can be formed without inducing deterioration of characteristics of the semiconductor device. This semiconductor device includes a semiconductor substrate, a circuit element, that includes a PN junction formed of a region, which is formed on the semiconductor substrate, and which has a conductivity type different from that of the substrate and a protection element for the circuit element. The protection element is a transistor formed of the region, another region having the conductivity type same as that of the region, and the semiconductor substrate. The emitter for the transistor and the semiconductor substrate are connected to each other.

16 Claims, 16 Drawing Sheets

(56) References Cited

U.S. PATENT DOCUMENTS

| | | | |
|---|---|---|---|
| 2011/0180845 A1* | 7/2011 | Mallikarjunaswamy | 257/173 |
| 2013/0307017 A1* | 11/2013 | Chen | 257/133 |

FOREIGN PATENT DOCUMENTS

| | | |
|---|---|---|
| JP | 2007173524 | 7/2007 |
| JP | 2008205148 | 9/2008 |
| JP | 2009295764 | 12/2009 |
| JP | 2010109165 | 5/2010 |
| JP | 2010232572 | 10/2010 |

OTHER PUBLICATIONS

International Preliminary Report on Patentability, International Application No. PCT/JP2012/054997, Dated Sep. 2, 2014.

* cited by examiner

SEMICONDUCTOR DEVICE

CROSS-REFERENCE TO RELATED APPLICATIONS

This application is the National Stage of International Application No. PCT/JP2012/054997 having International Filing date, 28 Feb. 2012, which designated the United States of America, and which International Application was published under PCT Article 21 (s) as WO Publication 2013/128583 A1, the disclosures of which are incorporated herein by reference in their entireties.

FIELD

The presently disclosed embodiment relates to semiconductor devices where an element for protecting a bipolar transistor or a junction field effect transistor used in input circuits of semiconductor devices from electrostatic discharge (ESD) is formed, and particularly, to a semiconductor device where an additional step for forming the protective element is suppressed and its occupation area is reduced.

BACKGROUND

Nowadays, semiconductor devices such as semiconductor integrated circuits are used in a variety of fields, for example, for civilian use such as mobile communications terminals, display equipment, and laptop computers, as well as for industrial use such as various productive equipment and industrial robots. Meanwhile, with the expansion of application filed, a required reliability level is increased. Particularly, in the application fields involving human lives such as medical devices and transportation equipment, an extra-high reliability is required.

However, a semiconductor device having a general structure in which the device is formed on a semiconductor substrate is very vulnerable to ESD caused by, for example, a contact with a person retaining electricity, along with a refinement of rules of wiring on substrate. Thus, to protect such semiconductor device from ESD, an ESD protective element is provided in the input circuit of the semiconductor device.

FIGS. 28 and 29 are circuit diagrams showing the periphery of a protective element of an input circuit of a conventional semiconductor device. In FIG. 28, diodes 30 as ESD protective element are connected between an input terminal 13 and an upper voltage source terminal 15/a lower voltage source terminal 14 to protect each element of the input circuit using breakdown of p-n junction. In FIG. 29, an ESD protective element 31 is connected between an input terminal 13 and a lower voltage source terminal 14. The ESD protective element 31 is composed of several circuit elements, whose examples are disclosed in Patent Documents 1 to 3. The ESD protective elements described in Patent Documents 1 and 2 use breakdown of p-n junction of a transistor therein. The ESD protective element described in Patent Document 3 makes a zener diode and a field effect transistor therein operate with respect to application of overvoltage due to ESD and function as a protective element.

Since these conventional ESD protective elements are provided specially to protect circuit elements such as a transistor in the input circuit, the region for forming the ESD protective element is required in addition to the region which is needed in order that a semiconductor device has its original functions. In the production process, the step for forming the ESD protective element is also required.

SUMMARY

As described above, in conventional semiconductor devices, a dedicated protective element is formed between each voltage source terminal and an input terminal to protect a bipolar transistor or junction field effect transistor used in an input circuit from ESD. Therefore, regions of the protective elements depending on their sizes and number are needed in addition to regions needed for the original functions of the semiconductor device, which results in an increase in the overall area of the semiconductor device.

Moreover, in the conventional semiconductor devices, to allow the protective element to protect the transistor of the input circuit, the protective element needs to function at a lower voltage than the breakdown voltage of the transistor of the input circuit, thus the protective element needs to be formed in a different process step from that for the transistor. The additional process step leads to an increase in the production cost of the semiconductor device.

Furthermore, since the conventional protective element is additionally connected to a base terminal, etc. of the transistor of the input circuit, this may affect the characteristics of the input circuit, and may increase the parasitic capacity of the input circuit, leakage current, and noise. As a result, the performance of the semiconductor device may be degraded.

The presently disclosed embodiment is made to solve these problems. An aspect of the presently disclosed embodiment is to provide a semiconductor device comprising a protective element that can be formed without requiring an additional process step with an area smaller than the conventional protective elements, and that can protect the transistor of the input circuit from ESD without performance degradation of the semiconductor device.

Generally, in the development of protective elements, particularly in the development of ESD protective elements, it is necessary to design a trigger mechanism for determining a voltage at which the protective element operates, and to design a mechanism for sending current to suppress ESD voltage. In determining the voltage at which the protective element operates, the inventors of the presently disclosed embodiment found that in a PNP transistor formed in semiconductor device, a p-n junction formed between n-type region being the base thereof and p-type semiconductor substrate being the collector thereof is not immediately destroyed by applying an ESD voltage that is over breakdown voltage. FIG. 27 shows measurements of current-voltage characteristics at the time of the breakdown of p-n junction described above obtained with TLP (Transmission Line Pulser) that is a device for evaluating current-voltage characteristics of a circuit element with respect to application of surge voltage. As shown in the figure, a breakdown occurs around 40 V, but destruction does not immediately occur. By subsequently sending current, destruction finally occurs at a little less than 90 V. Using this phenomenon, the inventors invented to get the protective element to work within the range of the breakdown voltage to the destruction voltage.

The inventors continued to study earnestly and found a method where a junction between the base and the collector (p-type semiconductor substrate) of the PNP transistor is used as a junction between the collector and the base of an NPN transistor. In the method, using the NPN transistor as the element operating within the above voltage range, when ESD voltage is applied, breakdown is caused between the collector and the base of the NPN transistor, and the NPN transistor is turned on by the subsequent current to send ESD current to the p-type semiconductor substrate through the transistor. The NPN transistor can be formed using the base region of the PNP transistor as collector and the p-type semiconductor substrate as base only by providing an n-type region as emitter in the p-type semiconductor substrate. Furthermore, through the connection of the emitter of the NPN transistor and the p-type semiconductor substrate, the NPN transistor itself is turned on by a potential difference between the base and the emitter of the transistor caused by current flowing in the p-type semiconductor substrate after the breakdown between the collector and the base of the NPN transistor and parasitic resistance in the substrate, and ESD current can be sent to the p-type semiconductor substrate through the transistor.

The semiconductor device of the presently disclosed embodiment comprises a first conductivity type semiconductor substrate, a first region of a second conductivity type semiconductor layer formed on the surface of the semiconductor substrate, a circuit element including a p-n junction formed from the semiconductor substrate and the first region, an input terminal connected to the first region, and a protective element for protecting the circuit element from ESD applied to the input terminal. The protective element includes a transistor formed by using the first region as collector, the semiconductor substrate as base, and the second region as emitter through the formation of a second region of the second conductivity type semiconductor layer in the semiconductor substrate, and is formed by connecting the emitter to the semiconductor substrate through a connection region provided in the semiconductor substrate by an electric conductor.

If the connection region provided on the semiconductor substrate is provided between the first region and the second region, voltage generated between the base and the emitter of the transistor may decrease and the transistor may not be turned on. Therefore, the connection region should preferably be disposed on the opposite side of the side on which the second region faces the first region.

The first region may be divided into a plurality of regions, each of the plurality of the first regions may be used to form a plurality of the circuit elements, and the second region of the protective element may be formed in one piece among the plurality of the first regions.

It is preferred to make at least one part of the contour of the first region on the surface of the semiconductor substrate a curve, form the second region next to the first region, and make the contour of a part of the second region opposing the first region a curve along the curve of the first region in that the protective element maintains the capability of sending ESD current, increasing the breakdown voltage of the p-n junction.

In a layer under the first region, a second conductivity type region having a impurity concentration higher than that of the first region may be formed, while a layer under the second region may be in contact with the semiconductor substrate directly.

The second conductivity type semiconductor layer may be formed on the semiconductor substrate by epitaxial growth. The first and second regions may be formed by doping first conductivity type impurities into the epitaxial layer and separating the epitaxial layer.

The circuit element may be a vertical bipolar transistor using the first region as base, collector, or emitter, or may be a lateral bipolar transistor using the first region as base, collector, or emitter, or may be a junction field effect transistor using the first region as gate, source, or drain.

According to the presently disclosed embodiment, a protective element for protecting a circuit element of an input part constituting an integrated circuit is a transistor that uses a first conductivity type semiconductor substrate, a first region of a second conductivity type formed thereon, and a second region of the second conductivity type further formed the substrate as base, collector, and emitter, respectively, and the emitter is connected to the semiconductor substrate by an electric conductor. Therefore, when ESD is applied to the first region and breakdown current flows to p-n junction formed from the first region and the semiconductor substrate, voltage generated by the breakdown current flowing in the semiconductor substrate and specific resistance of the semiconductor substrate is applied between the base and the emitter of the transistor formed as protective element and the transistor is turned on. As a result, if ESD applied to the first region occurs, it is consumed as current flowing to the semiconductor substrate through the transistor of the protective element, and high-voltage is not applied between the first region and the semiconductor substrate and the p-n junction, namely the circuit element is not destroyed. Namely, the transistor as protective element functions and the circuit element is protected from ESD.

Furthermore, according to the presently disclosed embodiment, the first region of the second conductivity type semiconductor layer of a circuit element constituting an input part of an integrated circuit and the semiconductor substrate are used as the collector and the base of the protective element, respectively, and thus a transistor of the protective element can be constituted only by forming the emitter constituting the transistor as the second region of the second conductivity type semiconductor layer on the surface of the semiconductor substrate. Additionally, a resistive element for generating a potential difference between the base and the emitter to turn the transistor on uses specific resistance of the semiconductor substrate, and thus the space for the protective element can be composed of only the space for the second region of the second conductivity type semiconductor layer used as emitter and the space for a connection region formed on the surface of the semiconductor substrate for connecting the emitter to the semiconductor substrate. Accordingly, compared to the space for a conventional diode, transistor, and associated elements, the protective element can be formed with a much smaller occupation area.

Furthermore, according to the presently disclosed embodiment, as described above, the transistor of the protective element is formed using the region of the circuit element. The p-n junction is shared between the circuit element and the protective element. The protective element of the presently disclosed embodiment needs not be led to breakdown earlier than a protected element by lowering the breakdown voltage of the protective element than that of the protected element as conventional protective elements, and thus needs not be formed in a special process and can be formed only in the general process for forming a circuit element. Accordingly, man hours for forming the protective element can be significantly reduced, which results in a very low production cost.

Furthermore, according to the presently disclosed embodiment, since a protective element needs not be connected to a terminal of a protected circuit element of integrated circuit, etc., this may not affect the original performance of the circuit element, and the circuit element of the integrated circuit can be protected without causing performance degradation of the semiconductor device.

DETAILED DESCRIPTION

Figure 1:
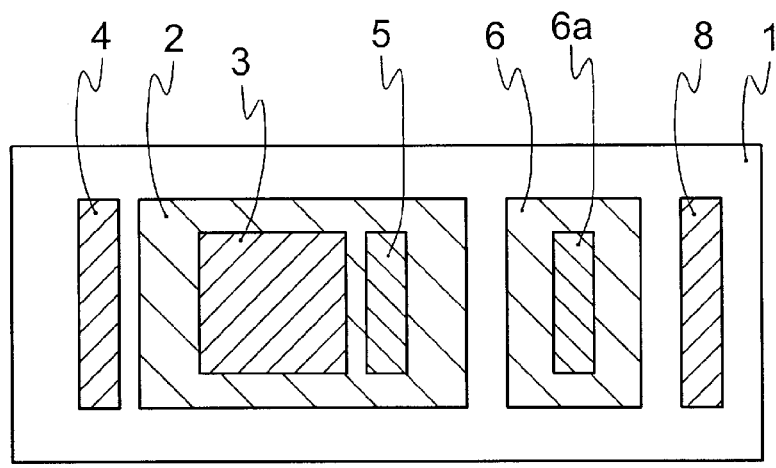
FIG. 1 is a plan view showing the periphery of a protective element of a semiconductor device according to a first aspect of the presently disclosed embodiment.
Figure 2:
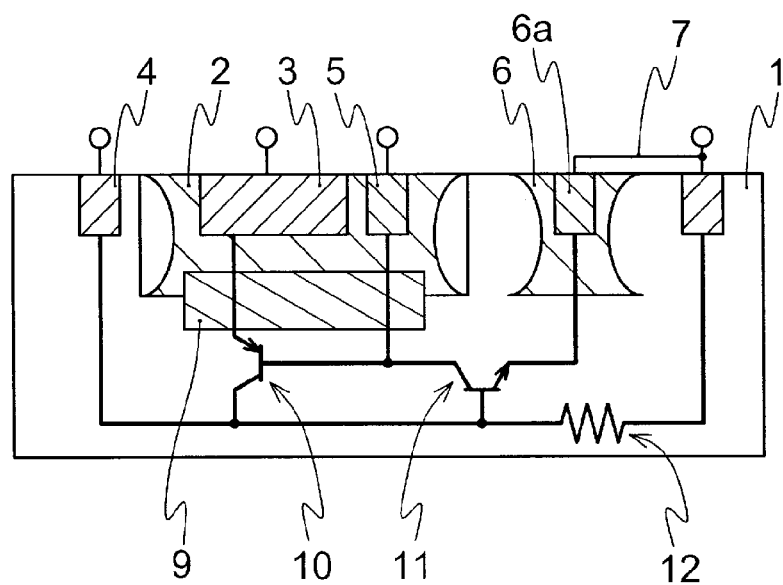
FIG. 2 is a cross-section view where an equivalent circuit is drawn in a cross section of the periphery of the protective element of the semiconductor device according to the first aspect of the presently disclosed embodiment.
Figure 3:
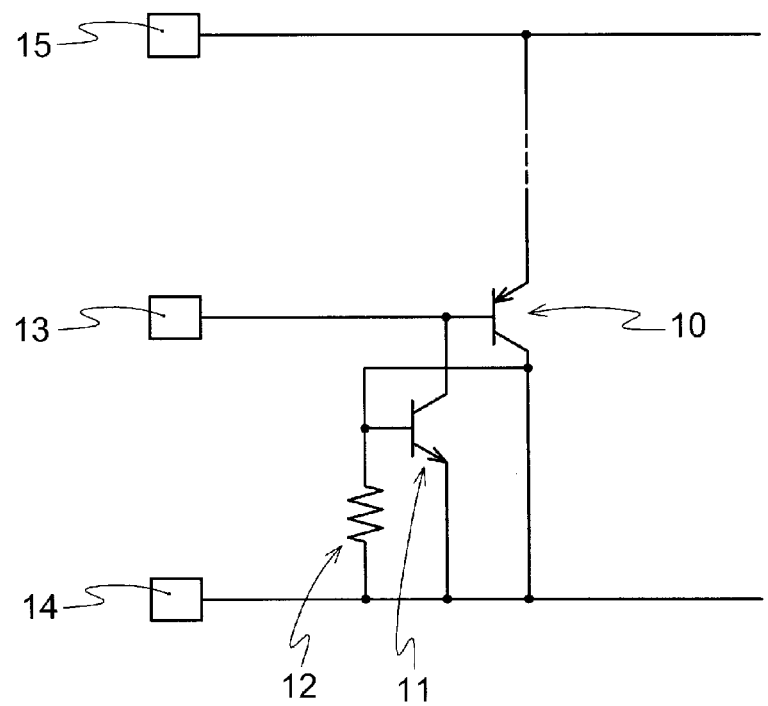
FIG. 3 is an equivalent circuit schematic of the periphery of the protective element of the semiconductor device according to the first aspect of the presently disclosed embodiment.

Referring to drawings, the semiconductor device of the presently disclosed embodiment will be described. FIGS. 1 to 3 show a plan view, a cross-section view, and an equivalent circuit schematic, respectively. The semiconductor device of the present invention has a first conductivity type semiconductor substrate (p-type semiconductor substrate in FIGS. 1 to 3) 1, a first region 2 of a second conductivity type semiconductor layer (n-type epitaxial semiconductor layer in FIGS. 1 to 3) formed on the surface of the semiconductor substrate 1, a circuit element (PNP transistor in FIGS. 1 to 3) 10 containing a p-n junction formed from the semiconductor substrate 1 and the first region 2, an input terminal 13 connected to the first region 2, and a protective element (NPN transistor in FIGS. 1 to 3) 11 for protecting the circuit element (PNP transistor) 10 from ESD applied to the input terminal 13. In the presently disclosed embodiment, the protective element (NPN transistor) 11 includes a NPN transistor 11 formed by using the first region 2 as collector, the semiconductor substrate 1 as base, and the second region 6 as emitter through the formation of the second region 6 of the second conductivity type semiconductor layer in the semiconductor substrate 1, and is formed by connecting the emitter (the second region 6) to the semiconductor substrate 1 through a connection region 8 by an electric conductor 7.

In the example shown in FIGS. 1 to 3, the circuit element 10 is formed as vertical PNP transistor 10 where an emitter 3 is a p-type region formed in the first region 2, the first region 2 is base, and the p-type semiconductor substrate 1 is collector, and it is an example of a semiconductor integrated circuit where the PNP transistor 10 constitutes an input part. The input terminal 13 is formed in the base (the first region 2) of the PNP transistor 10 through a contact region 5. However, the constitution of the input part is not limited to this example. The protective element of the presently disclosed embodiment can be used for various cases such as lateral PNP transistor and p-channel junction field effect transistor as described below. In FIGS. 1 to 3, 4 is the collector of the PNP transistor 10 and is also a contact region formed of p-type semiconductor provided in the semiconductor substrate 1, 9 is a buried region formed in a layer under the first region 2 for preventing a decrease in the breakdown voltage between the collector and the emitter, 14 is a lower voltage source terminal of the semiconductor substrate 1 corresponding to the collector of the PNP transistor 10, and 15 is an upper voltage source terminal.

In FIGS. 1 to 3, the protective element 11 is formed as the NPN transistor 11 where the first region 2 is collector, the semiconductor substrate 1 is base, and the second region 6 is emitter through the formation of the second region 6 of the second conductivity type (n-type) semiconductor layer on the surface side of the semiconductor substrate 1. The second region 6 as emitter is connected to the connection region (contact region) 8 provided on the surface of the semiconductor substrate 1 through a contact region 6a by an electric conductor 7 composed of, for example, aluminum and the like. As a result, the base of the NPN transistor 11 is connected to its emitter through a parasitic resistance 12 of the semiconductor substrate 1.

The connection region 8 of the semiconductor substrate 1 is formed on the opposite side of the first region 2 with reference to the second region 6. The connection region 8 can be disposed in other location on the semiconductor substrate 1, but the arrangement of the aspect is preferred. The reason is as follows: When ESD voltage is applied, p-n junction between the base and the collector of the NPN transistor 11 breaks down, and current flows through the parasitic resistance 12 of the p-type semiconductor substrate 1, and a potential difference occurs between the base and the emitter of the NPN transistor 11, and then the NPN transistor 11 is turned on. If the connection region 8 is provided between the first region 2 and the second region 6, the path in the semiconductor substrate 1 through which the current flows becomes shorter. Accordingly, a resistance value of the parasitic resistance 12 substantially decreases, and the potential difference generated between the base and the emitter of the NPN transistor 11 does not reach a predetermined value, and then the transistor may not be turned on.

In the layer under the first region 2, the buried layer 9 having an impurity concentration higher than that of the first region 2 is formed, as described above, while in the layer under the second region 6, such a buried region is not formed and the second region 6 is in contact with the semiconductor substrate 1 directly.

Since the collector and the base of the protective element 11 are composed of the base of the PNP transistor 10 and the p-type semiconductor substrate 1, respectively, the area needed for forming the protective element 11 is sufficient by adding only the areas of the second region 6 and the connection region 8 provided in the semiconductor substrate 1. As a result, for example, when a conventional protective device is formed, the area needs 7298 $\mu m^2$, while it is confirmed that the area is only 1504 $\mu m^2$ according to the embodiment. Namely, according to the disclosed embodiment, the added area for forming the protective element can be reduced by about 80% compared to the conventional protective element.

When the structure is shown by equivalent circuit schematic, it is as shown in FIG. 3. FIG. 2, the cross-section view also shows the PNP transistor 10, the NPN transistor 11 as protective element, and the parasitic resistance 12 between the base and the emitter of the NPN transistor 11. As clearly shown in FIG. 3, the NPN transistor 11 as protective element is connected between the input terminal 13 and the lower voltage source terminal 14.

Operation that the NPN transistor 11 functions as protective element in this structure will now be described. When positive overvoltage with reference to the p-type semiconductor substrate 1 is applied to the input terminal 13 of the semiconductor device of the disclosed embodiment due to ESD, the p-n junction between the collector and the base of the protective element 11 breaks down and current after the breakdown flows through the p-type semiconductor substrate 1 that is the base of the protective element 11. A potential difference between the base and the emitter of the protective element 11 is generated by the current and the parasitic resistance 12 of the p-type semiconductor substrate 1. When the potential difference reaches a predetermined value, the protective element 11 is turned on and sends current due to ESD from the collector to the emitter, namely the p-type semiconductor substrate 1, thereby, the PNP transistor 10 of the input circuit of the semiconductor device is protected from voltage due to ESD. Namely, as described above, even if the p-n junction breaks down, the p-n junction is not immediately destroyed with the voltage between 60 to 80 V. Therefore, if the specific resistance (impurity concentration) of the semiconductor substrate is set so that the voltage between the base and the emitter of the NPN transistor 11 reaches a threshold voltage at which the NPN transistor 11 is turned on with the current flowing through the semiconductor substrate between the breakdown and the destruction to turn on the NPN transistor 11, the NPN transistor 11 can be turned on and send the current after the breakdown to the side of the semiconductor substrate through the NPN transistor 11 to prevent the destruction of the p-n junction. In other words, the NPN transistor 11 as the protective element can be turned on to protect the PNP transistor 10 from ESD without the destruction of the p-n junction by setting the specific resistance of the semiconductor substrate based on the relation between the threshold voltage at which the NPN transistor 11 is turned on and the amount of the current after the breakdown.

Figure 4:
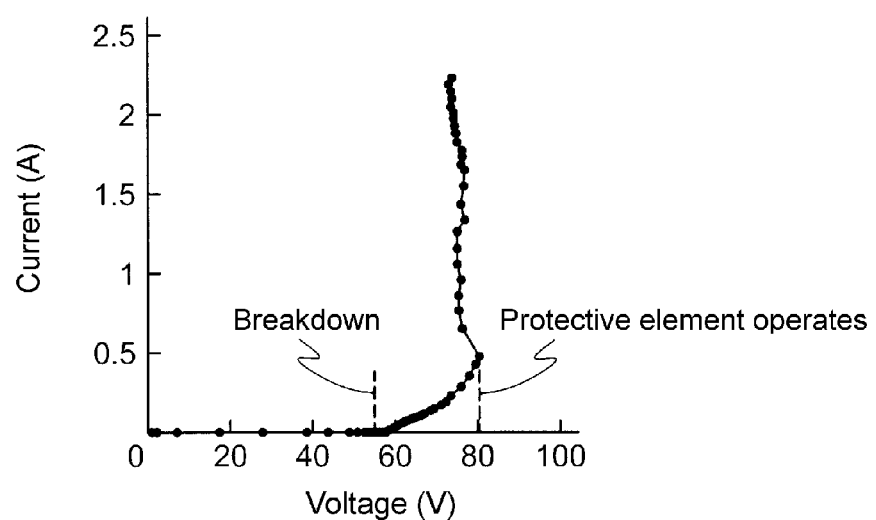
FIG. 4 shows measurements of current-voltage characteristics at the time of breakdown between the base and the collector of PNP transistor of an input circuit of the semiconductor device according to the first aspect of the presently disclosed embodiment.
Figure 27:
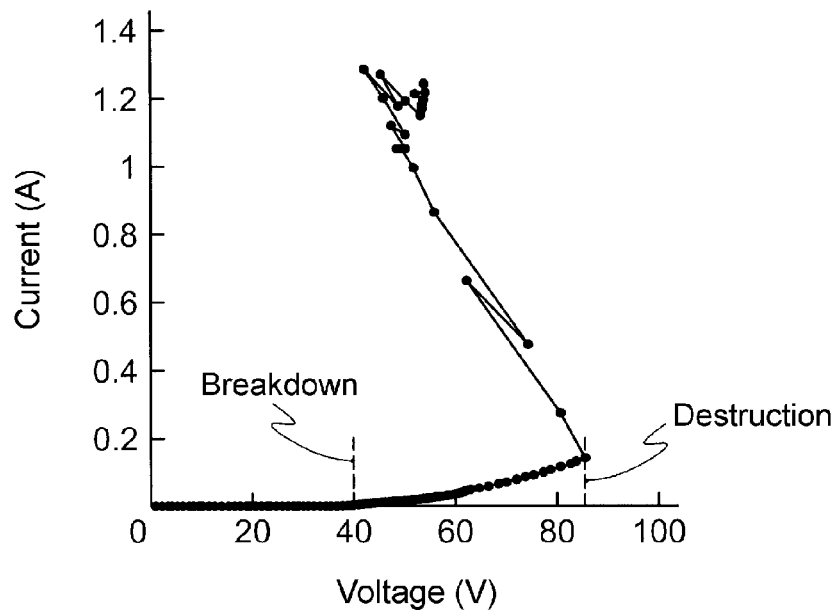
FIG. 27 shows measurements of current-voltage characteristics at the time of the breakdown between the base and the collector of PNP transistor where no protective element is connected.

This will now be described using the relation between ESD voltage and breakdown current shown in FIG. 4. FIG. 4 shows measurements of current-voltage characteristics at the time of the breakdown between the base and the collector of the PNP transistor 10 of the input circuit of the semiconductor device according to the disclosed embodiment, obtained by the same method as that for measurements in FIG. 27. The drawing shows as follows: The breakdown between the base and the collector of the NPN transistor 11 that is the protective element starts around 60 V. The protective element 11 starts to operate around 80 V. Once the protective element 11 starts to operate, even if current due to ESD increases, overvoltage due to ESD is suppressed by sending the current from the collector of the NPN transistor 11 as the protective element to the p-type semiconductor substrate 1. The NPN transistor 11 functions as the protective element of the PNP transistor 10.

To obtain such performance of the protective element for protecting the circuit element of the semiconductor device from ESD, the above-mentioned specific resistance of the p-type semiconductor substrate should preferably be around 5 to around 50 Ω·cm, and the depths of the first and the second regions from the surface of the semiconductor device should preferably be around 3 to around 20 μm so as not to cause a significant increase in the voltage at which the NPN transistor 11 as the protective element is turned on, a significant decrease in the current amplification factor of the transistor, and occurrence of punch-through after the operation of the transistor.

Since the semiconductor device according to the presently disclosed embodiment does not particularly require an additional process step, the device can be produced in the general production process of semiconductor devices. The first region 2 and the second region 6 of the n-type semiconductor described above may be formed by forming a film on the semiconductor substrate by epitaxial growth and then doping p-type impurities whose conductivity type is the same as that of the semiconductor substrate and separating the epitaxial layer. Alternatively, the first region 2 and the second region 6 can be formed by doping n-type impurities into p-type semiconductor substrate and then annealing.

In the disclosed embodiment, the example where the semiconductor substrate 1 is p-type, the first region is n-type, the circuit element is PNP transistor, and the protective element is NPN transistor has been described. However, when the semiconductor substrate 1 is n-type and the conductivity types of the other components are opposite, the function of the protective element can be fulfilled similarly. In this case, the transistor of the protective element functions for negative overvoltage with reference to the semiconductor substrate applied to the input terminal 13. The same goes for the following aspects.

Figure 5:
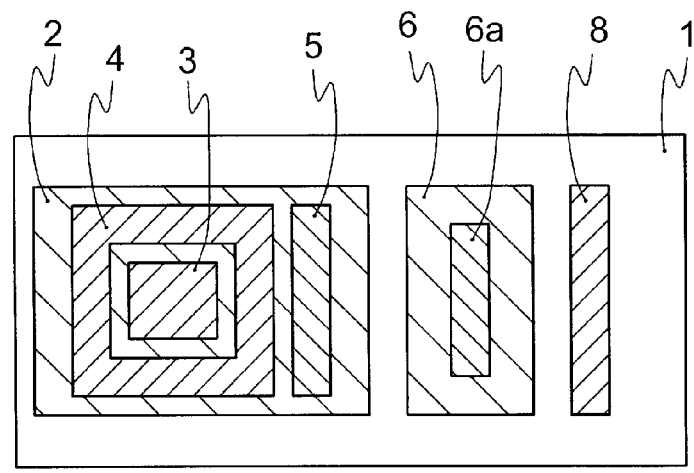
FIG. 5 is a plan view showing the periphery of a protective element of a semiconductor device according to a second aspect of the presently disclosed embodiment.
Figure 6:
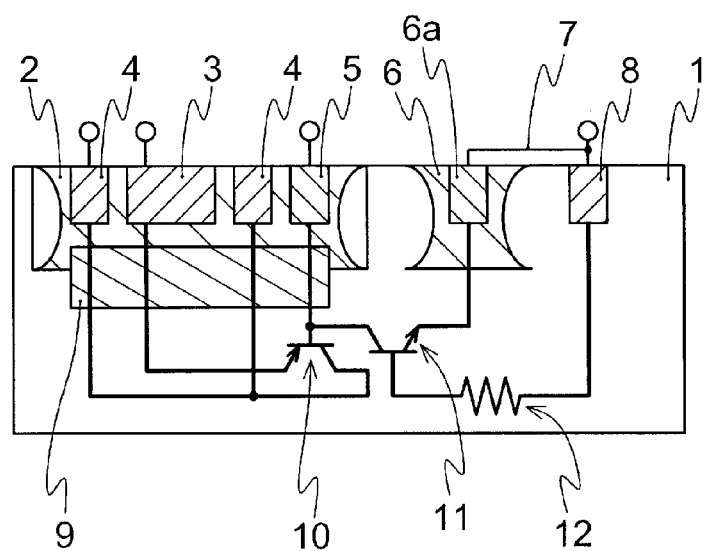
FIG. 6 is a cross-section view where an equivalent circuit is drawn in a cross section of the periphery of the protective element of the semiconductor device according to the second aspect of the presently disclosed embodiment.
Figure 7:
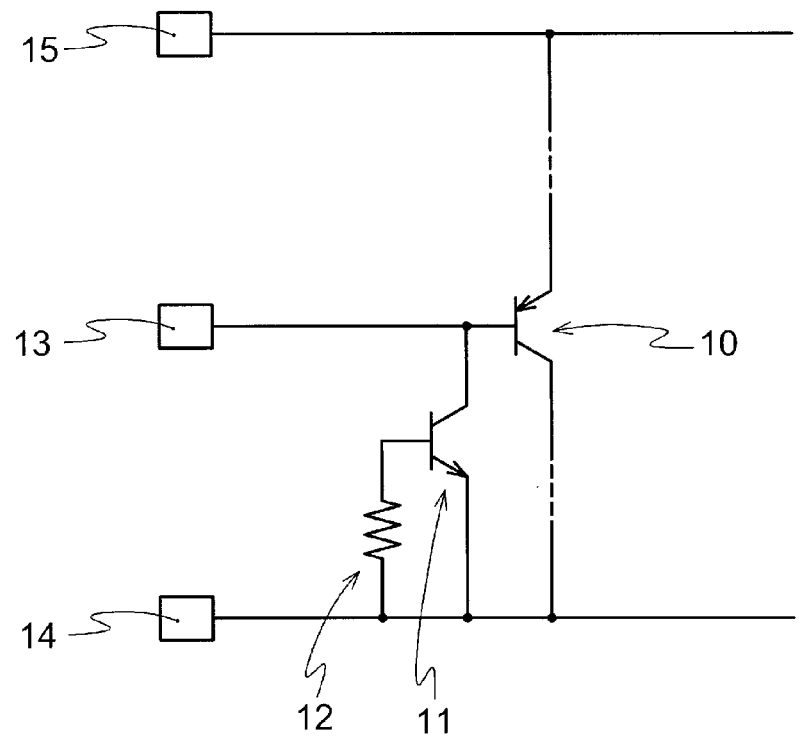
FIG. 7 is an equivalent circuit schematic of the periphery of the protective element of the semiconductor device according to the second aspect of the presently disclosed embodiment.

FIGS. 5 to 7 are a plan view of the semiconductor structure, a cross-section view, and an equivalent circuit schematic of a semiconductor device according to a second aspect of the presently disclosed embodiment, respectively. In the disclosed embodiment, the circuit element is a lateral PNP transistor, which is different from the first aspect of the disclosed embodiment. As shown in FIGS. 5 and 6, the structural difference from the first aspect of the disclosed embodiment is only that a collector 4 of a PNP transistor 10 is not the p-type semiconductor substrate 1 in the first aspect of the disclosed embodiment, but a p-type semiconductor region formed around an emitter 3 of the transistor in a first region 2 of n-type semiconductor as described above. Also, in the equivalent circuit schematic in FIG. 7, it is different from the first aspect of the disclosed embodiment only in that the collector 4 of the PNP transistor 10 is not directly connected to the base (semiconductor substrate 1) of a protective element 11. The other structural points are the same as those of the first aspect of the disclosed embodiment, and thus in each pair of FIGS. 1 and 5, FIGS. 2 and 6, as well as FIGS. 3 and 7, the same symbols are used in the corresponding parts and the detailed descriptions are omitted.

In the disclosed embodiment, unlike the first aspect of the disclosed embodiment, the p-type semiconductor substrate 1 is insulated from the emitter and the collector of the PNP transistor 10, which has an advantage of increasing the flexibility of designing a packaging structure and designing a pattern of a wiring board where the semiconductor device is mounted.

The semiconductor device according to the disclosed embodiment is different from the first aspect of the disclosed embodiment in that the protected circuit element is the lateral PNP transistor 10, but if ESD is applied to the input terminal 13, voltage is applied to the p-n junction with the p-type semiconductor substrate 1 through the first region 2 and the buried layer 9 having a high impurity concentration similarly as in the first aspect of the disclosed embodiment. However, since the protective element comprising the NPN transistor 11 is formed similarly as in the first aspect of the disclosed embodiment, the voltage can be suppressed and the lateral PNP transistor 10 as the circuit element is protected similarly as in the first aspect of the disclosed embodiment.

Figure 8:
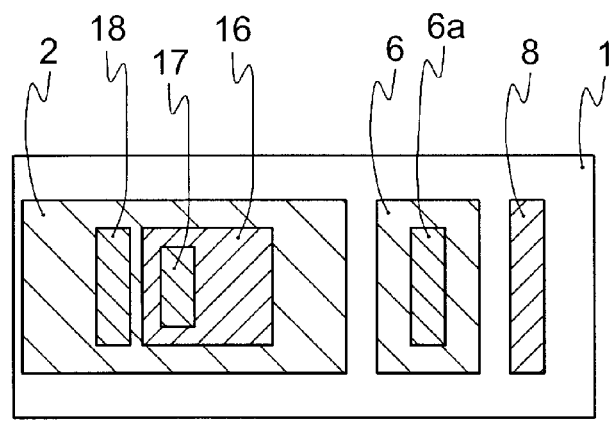
FIG. 8 is a plan view showing the periphery of a protective element of a semiconductor device according to a third aspect of the presently disclosed.
Figure 9:
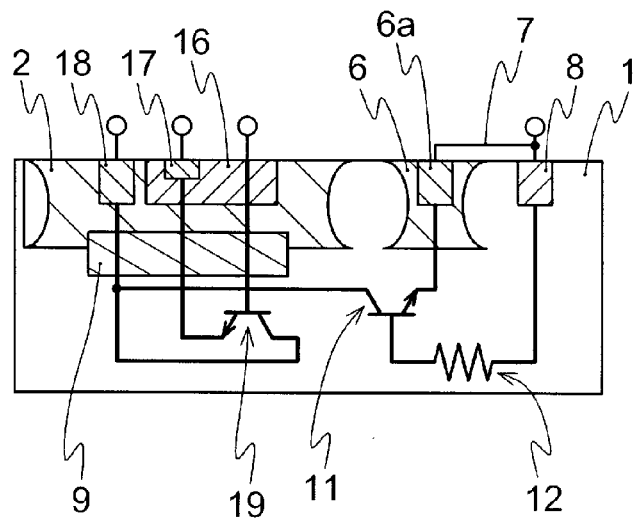
FIG. 9 is a cross-section view where an equivalent circuit is drawn in a cross section of the periphery of the protective element of the semiconductor device according to the third aspect of the presently disclosed embodiment.
Figure 10:
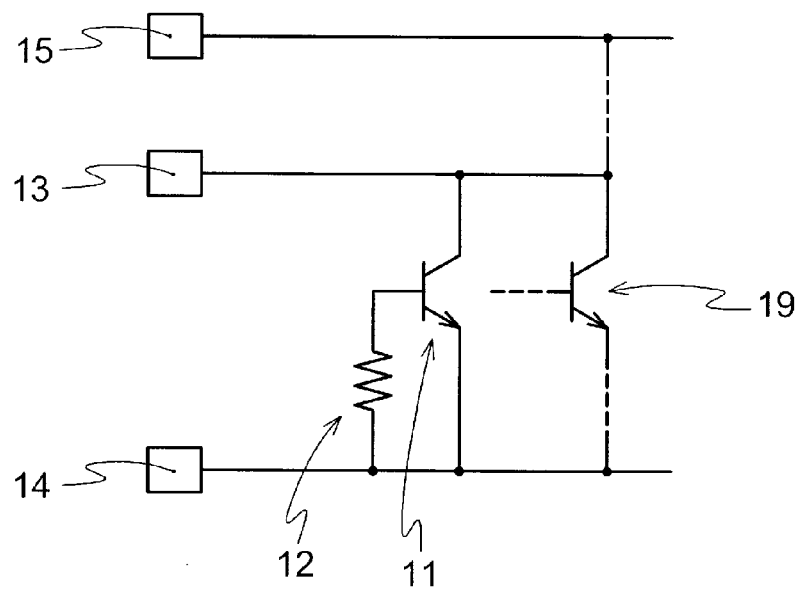
FIG. 10 is an equivalent circuit schematic of the periphery of the protective element of the semiconductor device according to the third aspect of the presently disclosed embodiment.

FIGS. 8 to 10 are a plan view of the semiconductor structure, a cross-section view, and an equivalent circuit schematic of a semiconductor device according to a third aspect of the disclosed embodiment, respectively. In the disclosed embodiment, the circuit element is an NPN transistor 19 and an input terminal 13 is connected to collector, which is different from the second aspect of the disclosed embodiment. As shown in FIGS. 8 and 9, the NPN transistor 19 is formed by using a first region 2 connected to the input terminal 13 through a contact region 18 as collector, a p-type region 16 formed in the first region 2 as base, and an n-type region 17 formed in the p-type region 16 as emitter. As shown in FIGS. 9 and 10, in the equivalent circuits, it is different from the second aspect of the disclosed embodiment in that the input terminal 13 and the collector of a protective element 11 is connected to the collector of the NPN transistor 19 as the circuit element. The other structural points are the same as those of the second aspect of the disclosed embodiment, and FIG. 5 corresponds to FIG. 8, FIG. 6 corresponds to FIG. 9, and FIG. 7 corresponds to FIG. 10, respectively, and thus the same symbols are used in the corresponding parts and the detailed descriptions are omitted. When ESD is applied to the input terminal 13, voltage is applied to the p-n junction with the p-type semiconductor substrate 1 through the first region 2 and the buried layer 9 similarly as in the first aspect of the disclosed embodiment. However, since the protective element 11 is formed similarly as in the first aspect of the disclosed embodiment, the voltage can be suppressed and the NPN transistor 19 as the circuit element is protected.

In FIGS. 8 and 9, the NPN transistor 19 is shown as vertical NPN transistor, but even if the NPN transistor 19 is a lateral NPN transistor formed by contacting the p-type region 16 as the base to the contact region 18 in the first region 2 as the collector, the protective element 11 fulfills the function of protecting the circuit element from ESD voltage applied to the input terminal 13 similarly. Furthermore, in the structure of the disclosed embodiment shown in FIGS. 8 and 9, even if the semiconductor device has an input circuit where the NPN transistor is formed by using the first region 2 as not collector but emitter, and the n-type region 17 formed in the p-type region 16 as not emitter but collector, and the emitter of the transistor is connected to the input terminal, the protective element 11 fulfills the function of protecting the circuit element from ESD voltage applied to the input terminal 13 similarly.

Figure 11:
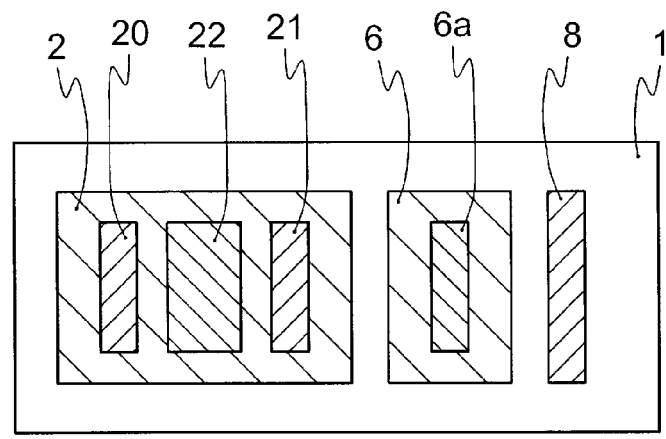
FIG. 11 is a plan view showing the periphery of a protective element of a semiconductor device according to a fourth aspect of the presently disclosed embodiment.
Figure 12:
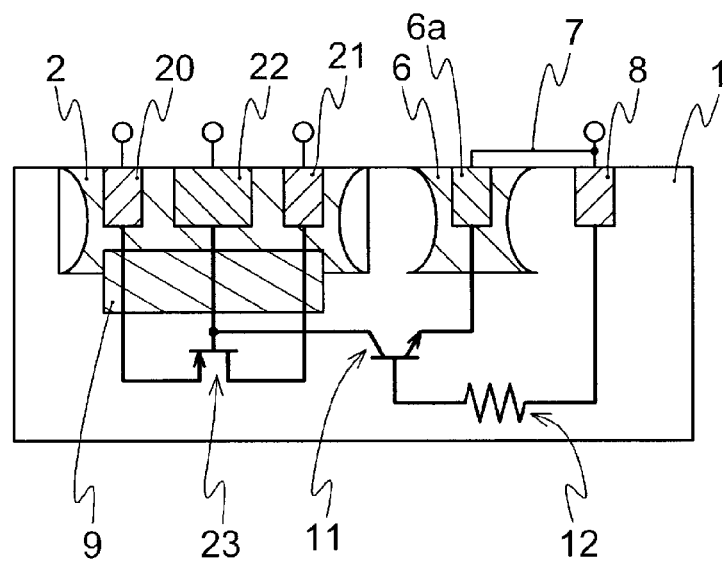
FIG. 12 is a cross-section view where an equivalent circuit is drawn in a cross section of the periphery of the protective element of the semiconductor device according to the fourth aspect of the presently disclosed embodiment.
Figure 13:
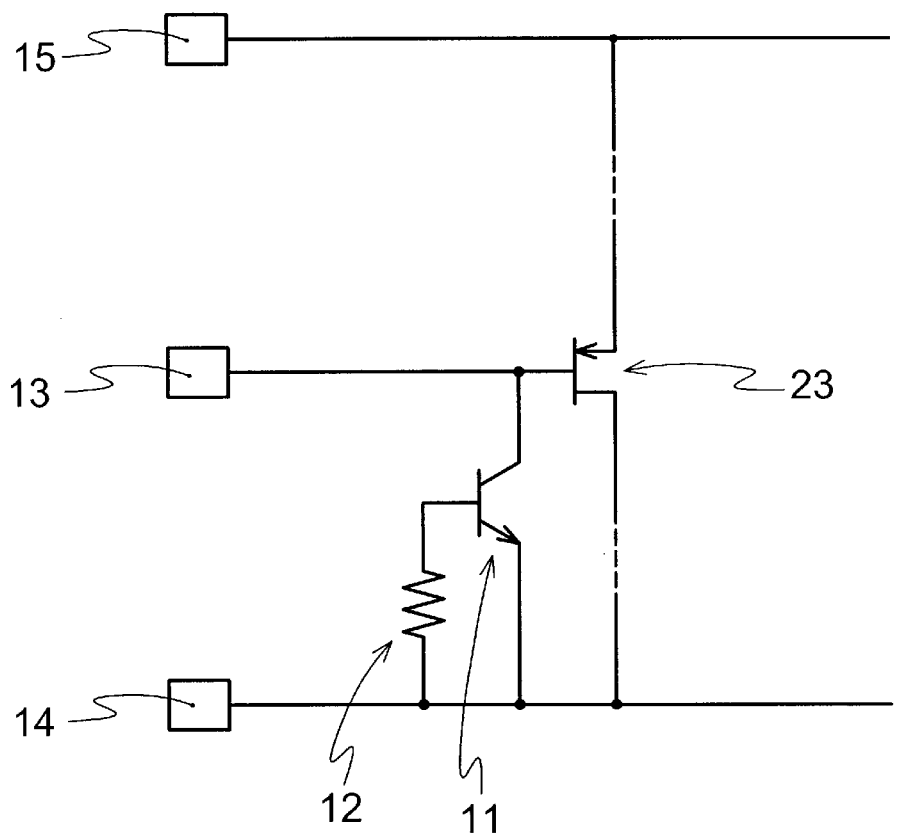
FIG. 13 is an equivalent circuit schematic of the periphery of the protective element of the semiconductor device according to the fourth aspect of the presently disclosed embodiment.

FIGS. 11 to 13 are a plan view of the semiconductor structure, a cross-section view, and an equivalent circuit schematic of a semiconductor device according to a fourth aspect of the disclosed embodiment of the, respectively. In the disclosed embodiment, the circuit element is a p-channel junction field effect transistor 23 and an input terminal 13 is connected to gate, which are different from the second aspect of the disclosed embodiment. As shown in FIGS. 11 and 12, the p-channel junction field effect transistor 23 is formed by using a first region 2 connected to the input terminal 13 through a contact region 22 as gate, a p-type region 20 formed in the first region 2 as source, and a p-type region 21 also formed in the first region 2 as drain. As shown in FIGS. 12 and 13, in the equivalent circuits, it is different from the second aspect of the disclosed embodiment in that the circuit element is the p-channel junction field effect transistor 23, and the input terminal 13 and the collector of a protective element 11 are connected to the gate of the p-channel junction field effect transistor 23. The other structural points are the same as those of the second aspect of the disclosed embodiment, and FIG. 5 corresponds to FIG. 11, FIG. 6 corresponds to FIG. 12, and FIG. 7 corresponds to FIG. 13, respectively, and thus the same symbols are used in the corresponding parts and the detailed descriptions are omitted. When ESD is applied to the input terminal 13, voltage is applied to the p-n junction with the p-type semiconductor substrate 1 through the first region 2 and the buried layer 9 similarly as in the first aspect of the disclosed embodiment. However, since the protective element 11 is formed similarly as in the first aspect of the disclosed embodiment, the voltage can be suppressed, and the p-channel junction field effect transistor 23 as the circuit element is protected.

Figure 14:
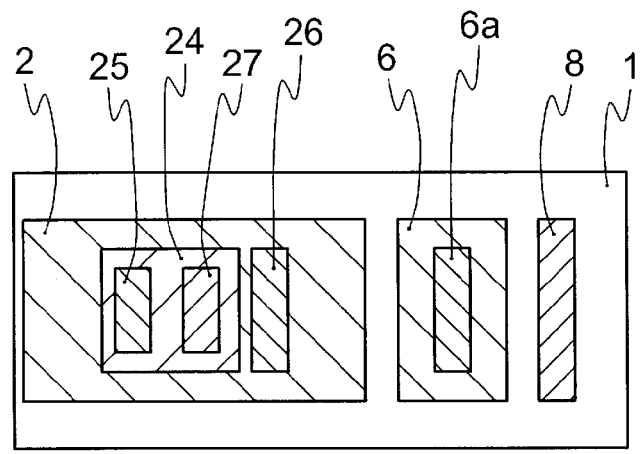
FIG. 14 is a plan view showing the periphery of a protective element of a semiconductor device according to a fifth aspect of the presently disclosed embodiment.
Figure 15:
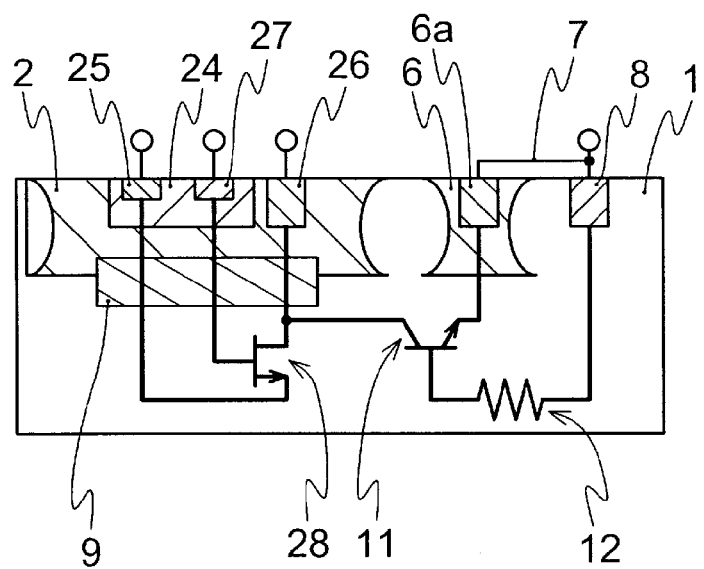
FIG. 15 is a cross-section view where an equivalent circuit is drawn in a cross section of the periphery of the protective element of the semiconductor device according to the fifth aspect of the presently disclosed embodiment.
Figure 16:
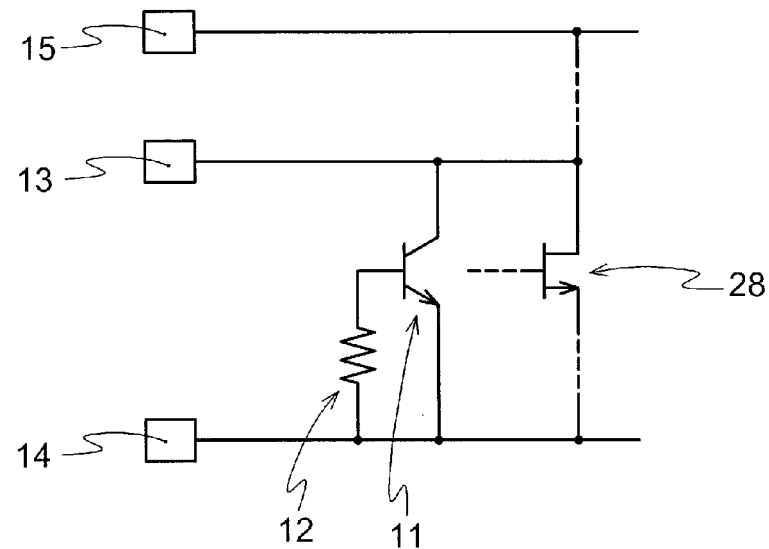
FIG. 16 is an equivalent circuit schematic of the periphery of the protective element of the semiconductor device according to the fifth aspect of the presently disclosed embodiment.

FIGS. 14 to 16 are a plan view of the semiconductor structure, a cross-section view, and an equivalent circuit schematic of a semiconductor device according to a fifth aspect of the disclosed embodiment, respectively. In the disclosed embodiment, the circuit element is an n-channel junction field effect transistor 28, and an input terminal 13 is connected to drain, which are different from the second aspect of the disclosed embodiment. As shown in FIGS. 14 and 15, the n-channel junction field effect transistor 28 is formed by using a first region 2 connected to the input terminal 13 through a contact region 26 as drain, a p-type region 24 having a contact region 27 and formed in the first region 2 as gate, and an n-type region 25 formed in the p-type region 24 as source. As shown in FIGS. 15 and 16, in the equivalent circuits, it is different from the second aspect of the disclosed embodiment in that the circuit element is the n-channel junction field effect transistor 28 and the input terminal 13 and the collector of a protective element 11 is connected to the drain of the n-channel junction field effect transistor 28. The other structural points are the same as those of the second aspect of the disclosed embodiment, and FIG. 5 corresponds to FIG. 14, FIG. 6 corresponds to FIG. 15, and FIG. 7 corresponds to FIG. 16, respectively, and thus the same symbols are used in the corresponding parts and the detailed descriptions are omitted. When ESD is applied to the input terminal 13, voltage is applied to the p-n junction with the p-type semiconductor substrate 1 through the first region 2 and the buried layer 9 similarly as in the first aspect of the disclosed embodiment. However, since the protective element 11 is formed similarly as in the first aspect of the disclosed embodiment, the voltage can be suppressed, and the circuit element, the n-channel junction field effect transistor 28 is protected.

In the structure of the disclosed embodiment shown in FIGS. 15 and 16, even if the semiconductor device has the input circuit where the n-channel junction field effect transistor is formed by using the first region 2 as not drain but source, and the n-type region 25 formed in the p-type region 24 as not source but drain, and the source of the transistor is connected to the input terminal, the protective element 11 fulfills the function of protecting the circuit element from ESD voltage applied to the input terminal 13 similarly.

Figure 17:
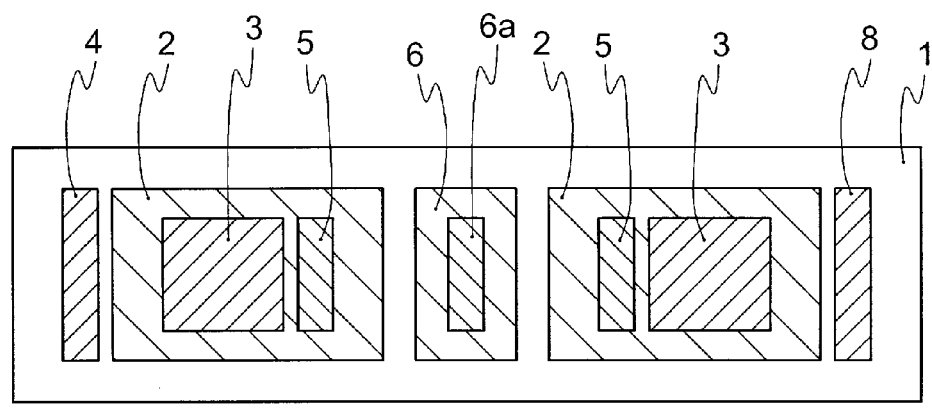
FIG. 17 is a plan view showing the periphery of a protective element of a semiconductor device according to a sixth aspect applied to the first aspect of the presently disclosed embodiment.
Figure 18:
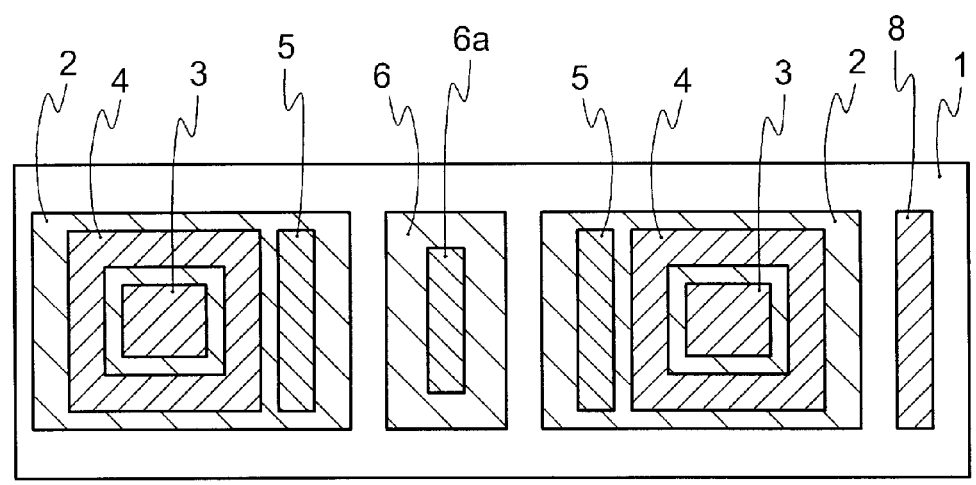
FIG. 18 is a plan view showing the periphery of a protective element of a semiconductor device according to the sixth aspect applied to the second aspect of the presently disclosed embodiment.
Figure 19:
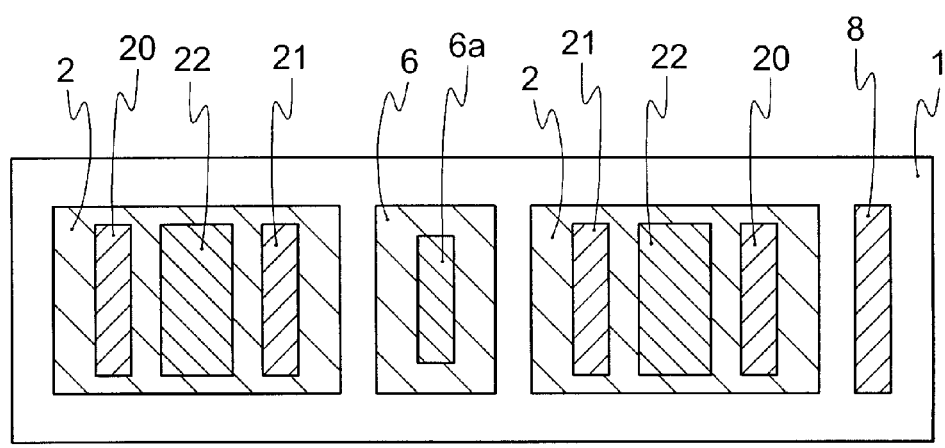
FIG. 19 is a plan view showing the periphery of a protective element of a semiconductor device according to the sixth aspect applied to the fourth aspect of the presently disclosed embodiment.

FIGS. 17 to 19 are plan views of the disclosed embodiment. As shown in the drawings, the two first regions 2 of the first, second, and fourth aspects of the disclosed embodiment are provided, respectively, the two protected circuit elements of those aspects of the disclosed embodiment are formed, respectively, and the second region 6 of those aspects of the disclosed embodiment constituting the protective element is provided in common therebetween, respectively. Namely, in FIGS. 17 to 19, respective regions of the first regions 2, as well as bases, emitters, and collectors constituting the PNP transistor 10, or gates, sources, and drains constituting the p-channel junction field effect transistor 23 are formed line-symmetrically, and each of the second region 6, the connection region 8 of the second region 6 and the semiconductor substrate 1, and the collector 4 of the vertical PNP transistor 10 in FIG. 17 is formed in one. However, the respective regions constituting the respective transistors formed in the first region 2 need not always be provided line-symmetrically, and the collector 4 or the connection region 8 of the vertical PNP transistor 10 can be provided in each of the two first regions By placing the two first regions 2, the p-n junctions between respective of the first regions 2 and the p-type semiconductor substrate 1 are formed, respectively. Therefore, the protective element 11 formed by using the first region 2 as collector is formed as multi-collector type NPN transistor with the two first regions 2 as collector, the p-type semiconductor substrate 1 as base, and the one second region 6 mentioned above as emitter. Accordingly, the one protective element 11 can function as protective element even if ESD voltage is applied to either of the two first regions 2, and thus one protective element can protect two transistors from ESD. In this regard, the semiconductor device of the presently disclosed embodiment can be formed with a smaller area than conventional semiconductor devices in which each transistor needs a protective element. FIGS. 17, 18, and 19 are drawings where the disclosed embodiment is applied to the first, second, and fourth aspects of the disclosed embodiment and the disclosed embodiment can also be applied to the third and fifth aspects of the disclosed embodiment.

Figure 20:
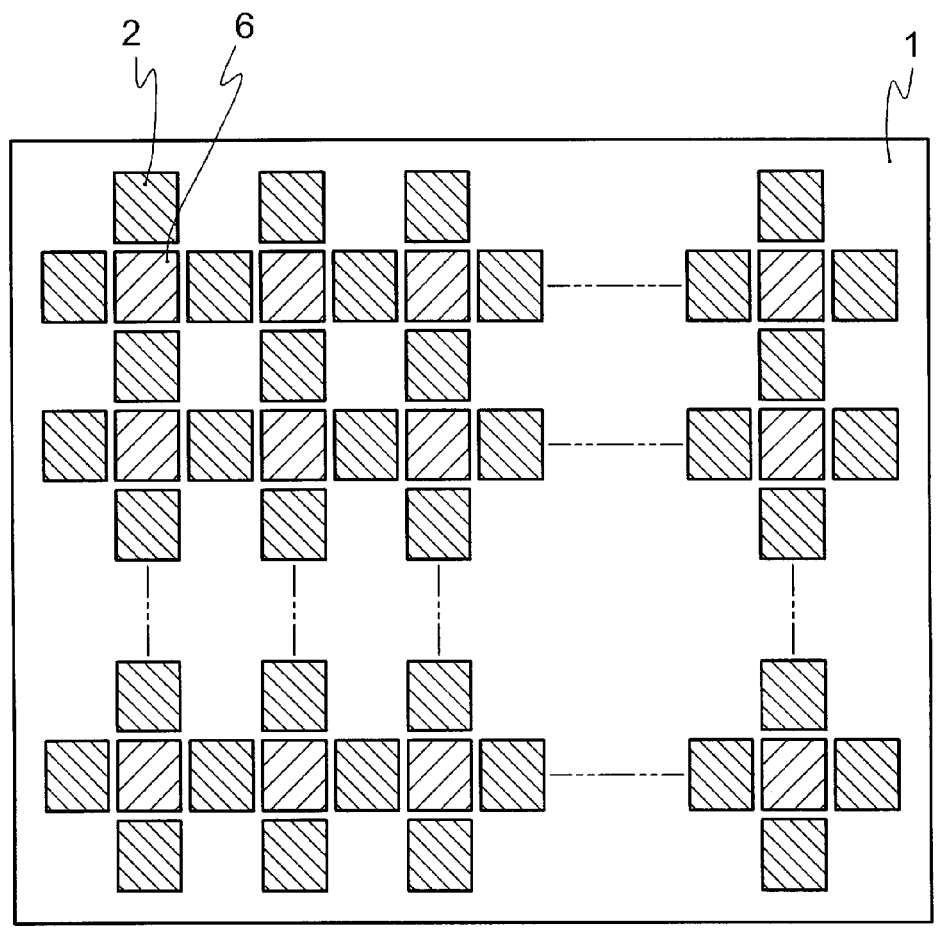
FIG. 20 is a plan view showing an arrangement of regions in a semiconductor device of an application example of the sixth aspect, etc. of the presently disclosed embodiment.

FIG. 20 shows an application of the sixth aspect of the disclosed embodiment, and is a plan view showing an arrangement of the first region 2 where the transistor is formed and the second region 6 used as the emitter of the protective element 11. In this example, the first regions 2 are arranged in rows and columns, and the second regions 6 are arranged among the first regions 2, respectively.

Similarly as in the sixth aspect of the disclosed embodiment, the protective element 11 is formed by using the second region 6 as emitter, and all of the first regions 2 arranged around the second region 6 as collector. Therefore, the one protective element 11 can function as the protective element of respective transistors formed in the four adjacent first regions 2. As can be seen from the application, as the number of protected transistors increases, the effect of reduction of area becomes larger compared to conventional semiconductor devices.

Figure 21:
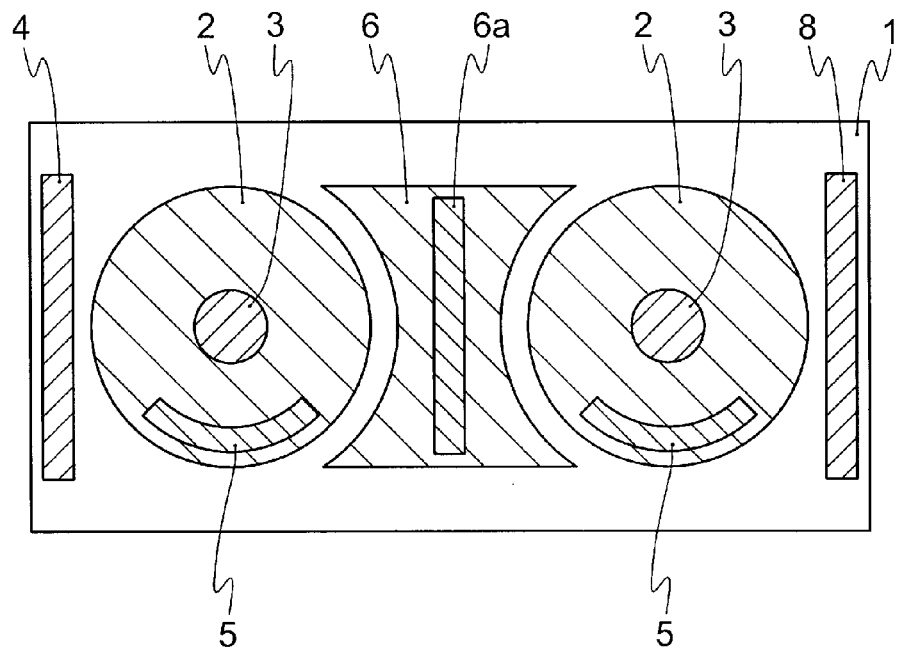
FIG. 21 is a plan view showing the periphery of a protective element of a semiconductor device according to a seventh aspect applied to the first aspect of the presently disclosed embodiment.
Figure 22:
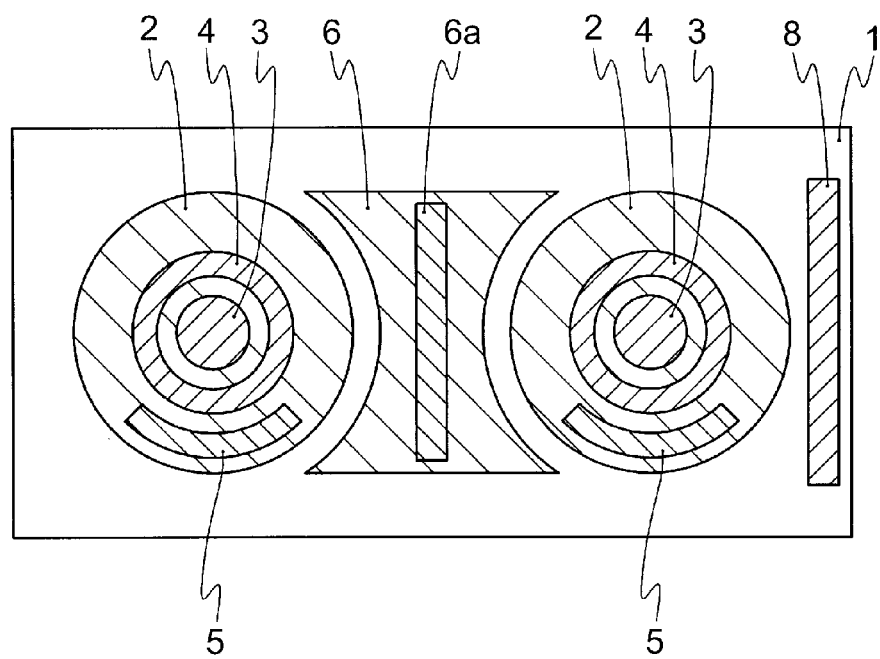
FIG. 22 is a plan view showing the periphery of a protective element of the semiconductor device according to the seventh aspect applied to the second aspect of the presently disclosed embodiment.

FIGS. 21 and 22 show examples where planar shape of the first region 2 of the first and second aspects of the disclosed embodiment is changed to circular shape. If the first region 2 is rectangle as shown in FIGS. 17 and 18 and voltage is applied between the region and the semiconductor substrate 1 where the region is formed, electric fields are concentrated around the four corners of the rectangle and a breakdown tends to occur around there. Therefore, shaping the first region 2 into a circular shape has an advantage of increasing the breakdown voltage of the junction of the first region 2 and the p-type semiconductor 1.

The amount of current the protective element 11 of the semiconductor device of the present invention can send from its collector to its emitter is inversely proportional to the width of the base of the protective element 11 because the base region is the semiconductor substrate 1 having a lower impurity concentration and a higher electrical resistance than those of the collector and the emitter. The substantial width of the base region of the protective element 11 is the distance between the first region that is the collector region and the second region that is the emitter region placed next to the first region.

Therefore, if the shape of the first region is circular, it is preferred to make the shape of a part of the second region opposing the first region along the shape of a part of the first region opposing the second region where the second region is formed next to the first region in maintaining the ability of sending a breakdown current due to ESD. In FIGS. 21 and 22, based on the concept, portions of the shape of the second region are curves, which has the advantage of increasing the breakdown voltage without lowering the ability of the protective element 11 to send current due to ESD. FIGS. 21 and 22 are examples applied to the structures of the first and the second aspects of the disclosed embodiment, and can also be applied to the structures of the third to fifth aspects of the disclosed embodiment.

Figure 23:
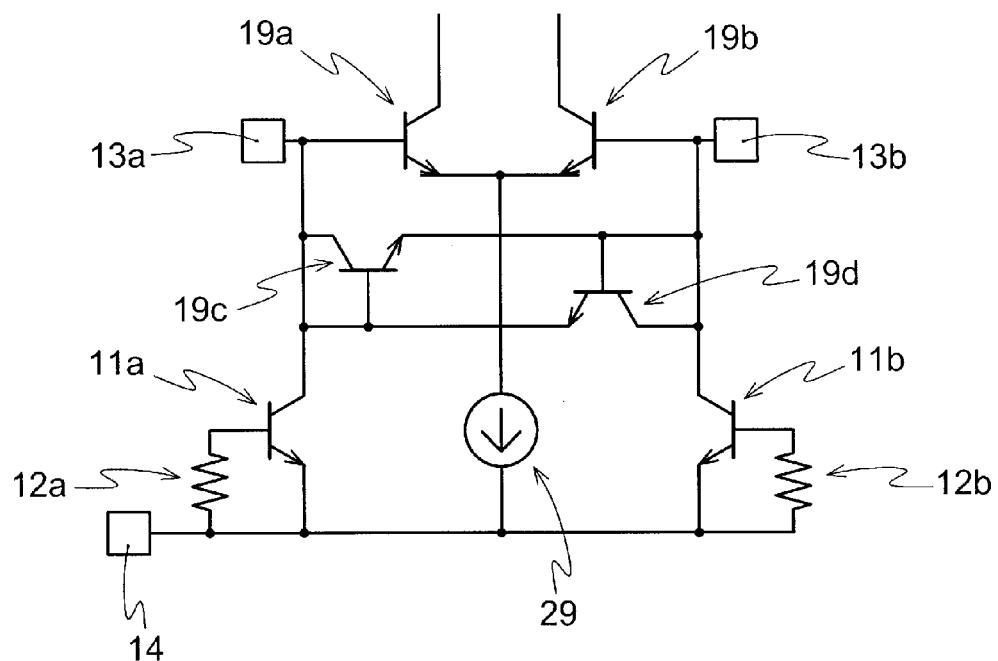
FIG. 23 is an equivalent circuit schematic of the periphery of a protective element of a semiconductor device according to an eighth aspect of the presently disclosed embodiment.
Figure 24:
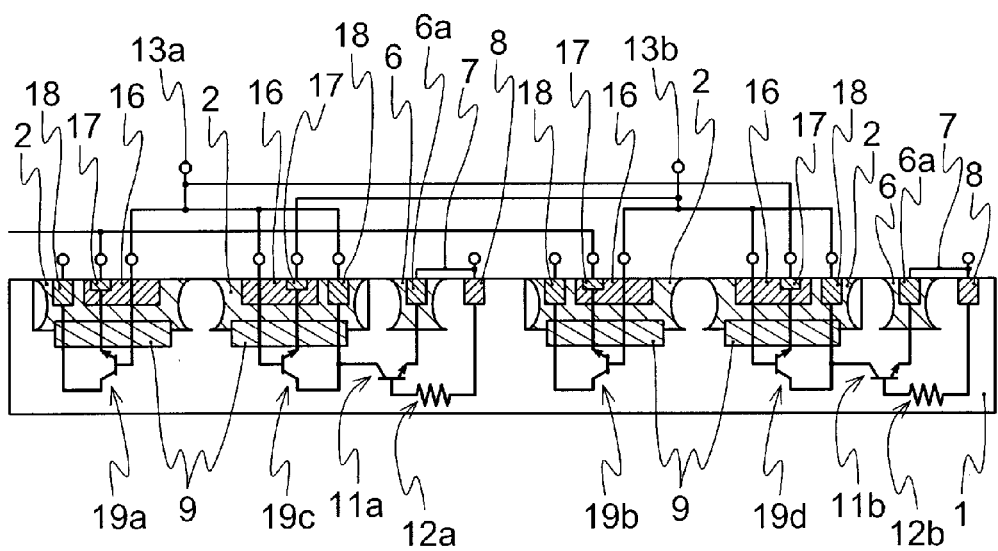
FIG. 24 is a cross-section view where the equivalent circuit of FIG. 23 is drawn in a cross section of the periphery of the protective element of the semiconductor device according to the eighth aspect of the presently disclosed embodiment.

FIGS. 23 and 24 are an equivalent circuit schematic and a cross-section view of the semiconductor structure of a semiconductor device according to an eighth aspect of the disclosed embodiment, respectively. The disclosed embodiment is assumed to be applied to the semiconductor device having an input circuit of differential input type comprising two input terminals 13a and 13b.

Referring to FIG. 23, the equivalent circuit of the disclosed embodiment comprises input terminals 13a and 13b, a pair of NPN transistors 19a and 19b constituting an differential input part, another pair of NPN transistors 19c and 19d for restricting excessive voltage difference between the input terminals 13a and 13b, protective elements 11a and 11b, parasitic resistances 12a and 12b of a p-type semiconductor substrate 1, and a current source 29. With respect to the NPN transistors 19a and 19b, their bases are connected to the input terminals 13a and 13b, the bases and collectors of the NPN transistors 19c and 19d, and the collectors of the protective elements 11a and 11b, respectively, and their emitters are connected to one end of the current source 29 together. The emitters of the NPN transistors 19c and 19d are connected to the bases of the NPN transistors 19d and 19c, respectively. With respect to the protective elements 11a and 11b, their bases are connected to one end of the parasitic resistances 12a and 12b, respectively, and their emitters are connected to the other end of the parasitic resistances 12a and 12b, the other end of the current source 29, and a lower voltage source terminal 14.

Since the collectors of the NPN transistors 19c and 19d are connected to the input terminals 13a and 13b similarly as in the third aspect of the disclosed embodiment, the protective elements 11a and 11b operate as the protective element of the NPN transistors 19c and 19d similarly as in the third aspect of the disclosed embodiment. With respect to the NPN transistors 19a and 19b, their bases are connected to the input terminals 13a and 13b. As described above, the protective elements 11a and 11b operate as protective element so that the NPN transistors 19c and 19d are not destroyed by ESD voltage applied to the input terminals 13a and 13b, and suppress voltage applied to the collectors, and thus excessive voltage leading to destruction is not applied to the bases of the NPN transistors 19a and 19b connected to the collectors. As a result, the protective elements 11a and 11b can substantially function as the protective element of all of the NPN transistors 19a to 19d.

Figure 25:
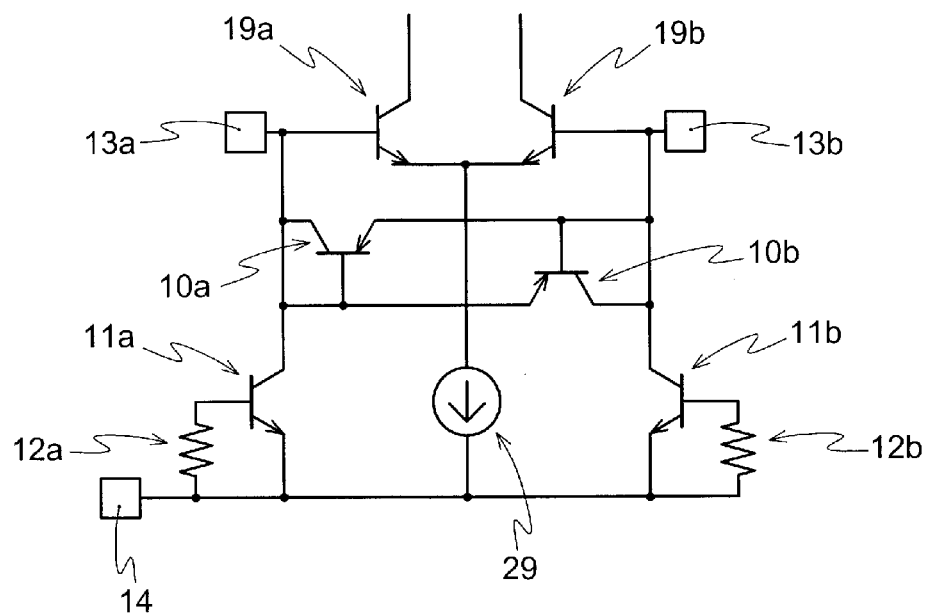
FIG. 25 is an equivalent circuit schematic of the periphery of a protective element of a semiconductor device according to a ninth aspect of the presently disclosed embodiment.
Figure 26:
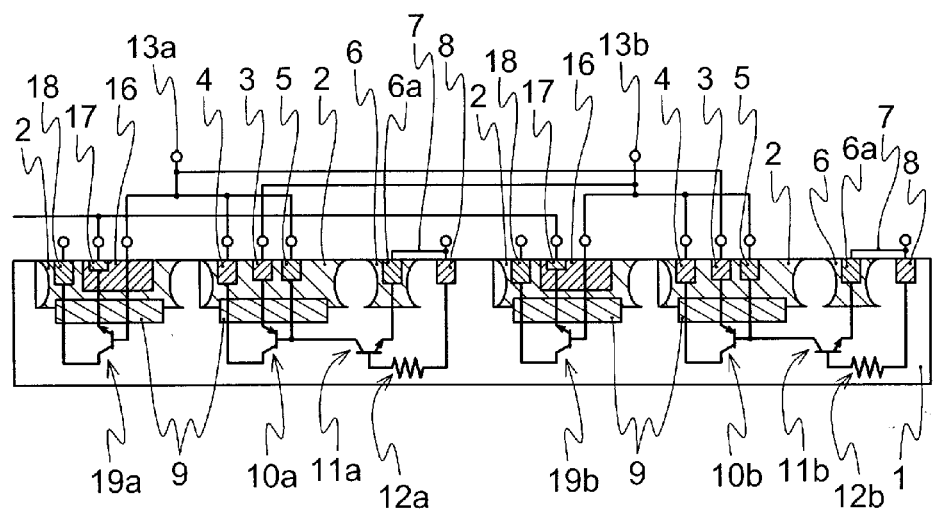
FIG. 26 is a cross-section view where the equivalent circuit of FIG. 25 is drawn in a cross section of the periphery of the protective element of the semiconductor device according to the ninth aspect of the presently disclosed embodiment.

FIGS. 25 and 26 are an equivalent circuit schematic and a cross-section view of the semiconductor structure of a semiconductor device according to a ninth aspect of the disclosed embodiment, respectively. In the disclosed embodiment, it is different from the eighth aspect of the disclosed embodiment in that a pair of transistors restricting excessive voltage difference between input terminals 13a and 13b are not NPN transistors 19c and 19d but PNP transistors 10a and 10b. The other structural points including connections between respective elements are the same as those of the eighth aspect of the disclosed embodiment, and thus the same symbols are used in the corresponding parts and the detailed descriptions are omitted.

Since the bases of the PNP transistors 10a and 10b are connected to the input terminals 13a and 13b similarly as in the second aspect of the disclosed embodiment, protective elements 11a and 11b operate as the protective element of the PNP transistors 10a and 10b similarly as in the second aspect of the disclosed embodiment. With respect to the NPN transistors 19a and 19b, their bases are connected to the input terminals 13a and 13b similarly as in the eighth aspect of the disclosed embodiment. Similarly as in the eighth aspect of the disclosed embodiment, the protective elements 11a and 11b operate as protective element so that the PNP transistors 10a and 10b are not destroyed by ESD voltage applied to the input terminals 13a and 13b, and suppress voltage applied to the bases, and thus excessive voltage leading to destruction is not applied to the bases of the NPN transistors 19a and 19b connected to the bases of the PNP transistors 10a and 10b. As a result, the protective elements 11a and 11b can substantially function as the protective element of all of the PNP transistors 10a and 10b and the NPN transistors 19a and 19b.

The semiconductor device of the presently disclosed embodiment can be used in a variety of industrial fields, for example, for consumer use such as display equipment and mobile communications terminals as well as for general industrial use such as various productive equipment, particularly, in industries related to mobile phones that are touched by people and where ESD is easily applied, and medical devices and transportation equipment where high reliability is required.

EXPLANATION OF SYMBOLS

Figure 28:
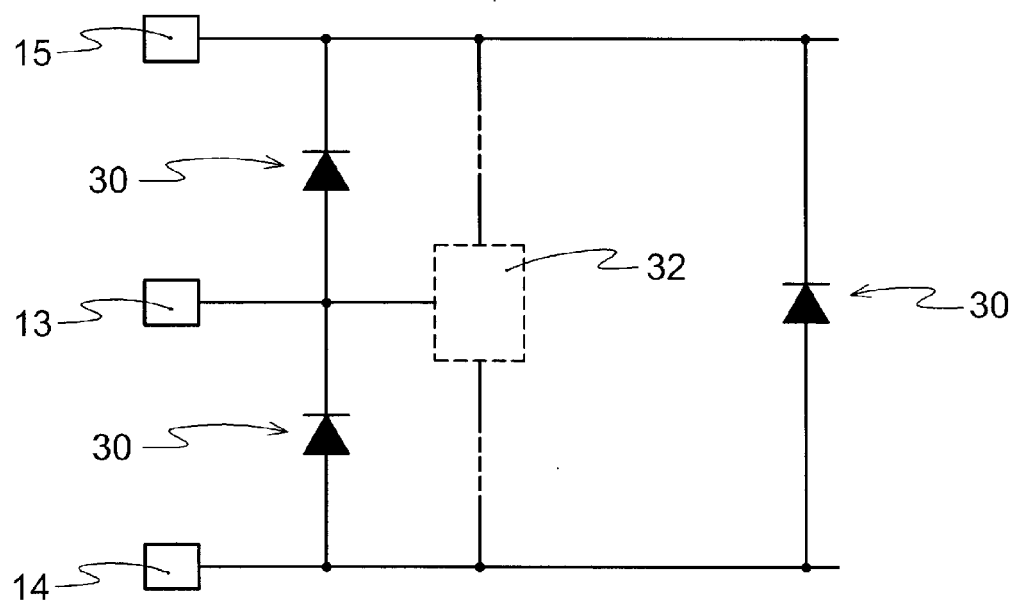
FIG. 28 is a circuit schematic showing the periphery of protective elements of an input circuit of a conventional semiconductor device.
Figure 29:
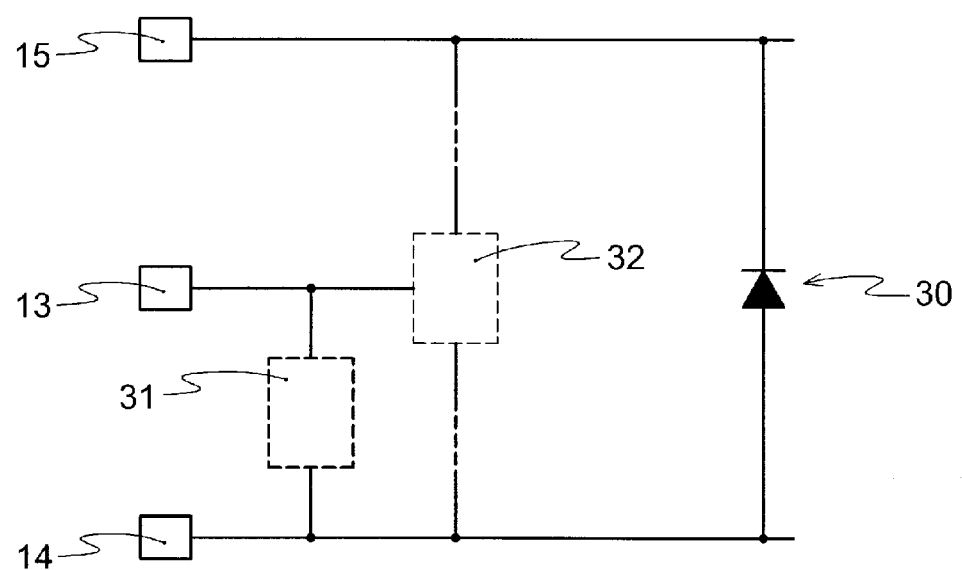
FIG. 29 is a circuit schematic showing the periphery of a protective element of another input circuit of a conventional semiconductor device.

1 P-type semiconductor substrate
2 First region of n-type semiconductor
3 Emitter of circuit element in first and second aspects of the disclosed embodiment
4 Collector of circuit element in first and second aspects of the disclosed embodiment
5 Contact region in first region 2
6 Second region of n-type semiconductor
6a Contact region of second region 6 of n-type semiconductor
7 Electric conductor
8 Connection region of second region of n-type semiconductor and p-type semiconductor substrate 1
9 N-type region (buried region) having an impurity concentration higher than that of first region
10, 10a, 10b Circuit element in first, second, and ninth aspects of the disclosed embodiment (PNP transistor)
11, 11a, 11b Protective element (NPN transistor)
12, 12a, 12b Parasitic resistance of p-type semiconductor substrate
13, 13a, 13b Input terminal
14 Lower voltage source terminal
15 Upper voltage source terminal
16 P-type region in first region 2 in third aspect of the disclosed embodiment
17 N-type region in p-type region 16 in third aspect of the disclosed embodiment
18 Contact region of first region 2 in third aspect of the disclosed embodiment
19, 19a, 19b, 19c, 19d Circuit element in third, eighth, and ninth aspects of the disclosed embodiment (NPN transistor)
20 P-type region in first region 2 in fourth aspect of the disclosed embodiment 21 Another p-type region in first region 2 in fourth aspect of the disclosed embodiment
22 N-type region in first region 2 in fourth aspect of the disclosed embodiment
23 Circuit element in fourth aspect of the disclosed embodiment (p-channel junction field effect transistor)
24 P-type region in first region 2 in fifth aspect of the disclosed embodiment
25 N-type region in p-type region 24 in first region 2 in fifth aspect of the disclosed embodiment
26 Contact region of first region 2 in fifth aspect of the disclosed embodiment
27 Contact region of p-type region 24 in first region 2 in fifth aspect of the disclosed embodiment
28 Circuit element in fifth aspect of the disclosed embodiment (n-channel junction field effect transistor)
29 Current source
30 Conventional ESD protective element (diode)
31 Another conventional ESD protective element
32 Circuit element in FIGS. 28 and 29 showing conventional art

What is claimed is:

1. A semiconductor device, comprising:
   a first conductivity type semiconductor substrate;
   a first region of a second conductivity type semiconductor layer formed on a surface of the semiconductor substrate;
   a circuit element including a p-n junction formed from the semiconductor substrate and the first region;
   an input terminal connected to the first region; and
   a protective element for protecting the circuit element from ESD applied to the input terminal, the protective element including a transistor formed by using the first region as a collector, the semiconductor substrate as a base, and a second region of the second conductivity type semiconductor layer formed in the semiconductor substrate as an emitter, the protective element being formed by connecting the emitter to the semiconductor substrate through a connection region provided in the semiconductor substrate by an electric conductor, wherein
   the first region is divided into a plurality of regions, a plurality of the circuit elements using each of the plurality of the first regions are formed, and the second region of the protective element is formed in one piece among the plurality of the first regions.

2. The semiconductor device of claim 1, wherein the connection region provided in the semiconductor substrate is formed on an opposite side of the first region with reference to the second region.

3. The semiconductor device of claim 1, wherein at least one part of a contour of the first region on the surface of the semiconductor substrate is a curve, the second region is formed next to the first region, and a contour of a part of the second region facing the first region has a curve along the curve of the first region.

4. The semiconductor device of claim 1, wherein a layer under the first region, which is a second conductivity type region having a higher impurity concentration than the first region is formed and wherein the second region is in contact with the semiconductor substrate directly.

5. The semiconductor device of claim 1, wherein the second conductivity type semiconductor layer is an epitaxial layer formed on the semiconductor substrate and the first and second regions are formed by doping first conductivity type impurities into the epitaxial layer and separating the epitaxial layer.

6. The semiconductor device of claim 1, wherein the circuit element is a vertical bipolar transistor using the first region as base.

7. The semiconductor device of claim 1, wherein the circuit element is a vertical bipolar transistor using the first region as collector.

8. The semiconductor device of claim 1, wherein the circuit element is a vertical bipolar transistor using the first region as emitter.

9. The semiconductor device of claim 1, wherein the circuit element is a lateral bipolar transistor using the first region as base.

10. The semiconductor device of claim 1, wherein the circuit element is a lateral bipolar transistor using the first region as collector.

11. The semiconductor device of claim 1, wherein the circuit element is a lateral bipolar transistor using the first region as emitter.

12. The semiconductor device of claim 1, wherein the circuit element is a junction field effect transistor using the first region as gate.

13. The semiconductor device of claim 1, wherein the circuit element is a junction field effect transistor using the first region as drain.

14. The semiconductor device of claim 1, wherein the circuit element is a junction field effect transistor using the first region as source.

15. A semiconductor device, comprising:
   a first conductivity type semiconductor substrate;
   a first region of a second conductivity type semiconductor layer formed on a surface of the semiconductor substrate;
   a circuit element including a p-n junction formed from the semiconductor substrate and the first region;
   an input terminal connected to the first region; and
   a protective element for protecting the circuit element from ESD applied to the input terminal, the protective element including a transistor formed by using the first region as a collector, the semiconductor substrate as a base, and a second region of the second conductivity type semiconductor layer formed in the semiconductor substrate as an emitter, the protective element being formed by connecting the emitter to the semiconductor substrate through a connection region provided in the semiconductor substrate by an electric conductor, wherein
   at least one part of a contour of the first region on the surface of the semiconductor substrate is a curve, the second region is formed next to the first region, and a contour of a part of the second region facing the first region has a curve along the curve of the first region, and
   a layer under the first region, which is a second conductivity type region having a higher impurity concentration than the first region is formed and wherein the second region is in contact with the semiconductor substrate directly.

16. The semiconductor device of claim 15, wherein the connection region provided in the semiconductor substrate is formed on an opposite side of the first region with reference to the second region.

* * * * *